US012676202B2

(12) United States Patent
Zhang et al.

(10) Patent No.: US 12,676,202 B2
(45) Date of Patent: Jul. 7, 2026

(54) SELECTIVE MEDIA SCANNING FOR A VIRTUAL BLOCK

(71) Applicant: MICRON TECHNOLOGY, INC., Boise, ID (US)

(72) Inventors: Peng Zhang, Los Altos, CA (US); Murong Lang, San Jose, CA (US); Zhenming Zhou, San Jose, CA (US); Lei Lin, Freemont, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 23 days.

(21) Appl. No.: 18/820,041

(22) Filed: Aug. 29, 2024

(65) Prior Publication Data

US 2026/0066020 A1 Mar. 5, 2026

(51) Int. Cl.
G11C 29/12 (2006.01)

(52) U.S. Cl.
CPC .................. G11C 29/12005 (2013.01); G11C 2029/1202 (2013.01)

(58) Field of Classification Search
CPC ...... G11C 29/12005; G11C 2029/1202; G06F 11/076
USPC ........................................................ 714/719
See application file for complete search history.

(56) References Cited

U.S. PATENT DOCUMENTS

| 8,208,322 | B2 | 6/2012 | Gorobets |
| 9,728,278 | B2 | 8/2017 | Muchherla et al. |

| 11,782,627 | B2 | 10/2023 | Muchherla et al. | |
| 11,783,901 | B2 | 10/2023 | Muchherla et al. | |
| 2015/0169403 | A1* | 6/2015 | Yen ...................... | G06F 11/0757 |
| | | | | 714/760 |
| 2017/0206032 | A1* | 7/2017 | Son ......................... | G06F 12/02 |
| 2018/0210646 | A1* | 7/2018 | Kasula ................... | G11C 5/143 |
| 2018/0341583 | A1* | 11/2018 | Son ....................... | G11C 16/349 |
| 2020/0066357 | A1* | 2/2020 | Oshiyama .......... | G11C 16/3431 |
| 2020/0365228 | A1 | 11/2020 | Cadloni et al. | |
| 2021/0034274 | A1* | 2/2021 | Muchherla ......... | G11C 16/3495 |
| 2021/0183456 | A1* | 6/2021 | Muchherla ............ | G11C 16/26 |
| 2022/0129187 | A1* | 4/2022 | Miller ................. | G06F 11/3037 |
| 2022/0199179 | A1* | 6/2022 | Padilla ................. | G06F 11/076 |
| 2023/0040070 | A1* | 2/2023 | Singh ................... | G06F 11/079 |
| 2024/0038311 | A1 | 2/2024 | Lien et al. | |

(Continued)

*Primary Examiner* — Albert Decady
*Assistant Examiner* — Osman M Alshack
(74) *Attorney, Agent, or Firm* — Tarolli, Sundheim, Covell & Tummino LLP

(57) ABSTRACT

A method for performing a media scan operation on a virtual block in a memory device is described herein. The method includes incrementing a first count value of a first read counter via a controller in response to a first read operation performed on a first fractional good block of the virtual block. The method also includes incrementing a second count value of a second read counter via the controller in response to a second read operation performed on a second fractional good block of the virtual block. The method also includes selecting one of the first and second fractional good blocks for the media scan operation via the controller based on a difference between the first and second count values. The method further includes performing the media scan operation on a wordline of the selected one of the first and second fractional good blocks via the controller.

17 Claims, 8 Drawing Sheets

(56) References Cited

U.S. PATENT DOCUMENTS

| 2024/0185924 A1 | 6/2024 | Lien et al. |
| 2024/0185935 A1 | 6/2024 | Lien et al. |

\* cited by examiner

200

CELLS

202

206

0 1 2 3 4 5 6 7

VOLTAGE

CELLS

204

208 208

0 1 2 3 4 5 6 7

VOLTAGE

300

306

SELECTIVE MEDIA SCANNING FOR A VIRTUAL BLOCK

TECHNICAL FIELD

This disclosure relates to memory devices, and particularly to selective media scanning for a virtual block.

BACKGROUND

Memory devices are widely used to store information in various electronic devices. A memory device includes memory cells. A memory cell is an electronic circuit capable of being programmed to a data state of two or more data states. For example, a memory cell may be programmed to a data state that represents a single binary value, often denoted by a binary "1" or a binary "0." As another example, a memory cell may be programmed to a data state that represents a fractional value (e.g., 0.5, 1.5, or the like). To store information, the electronic device may write to, or program, a set of memory cells. To access the stored information, the electronic device may read, or sense, the stored state from the set of memory cells. However, in response to multiple accesses of memory cells (reading data from and/or writing data to the memory cells), the quality of the memory cells for accurately storing data (e.g., without bit errors) can be degraded.

DETAILED DESCRIPTION

Figure 1A:
FIG. 1A illustrates system for decoding data from a memory sub-system.
Figure 1A:
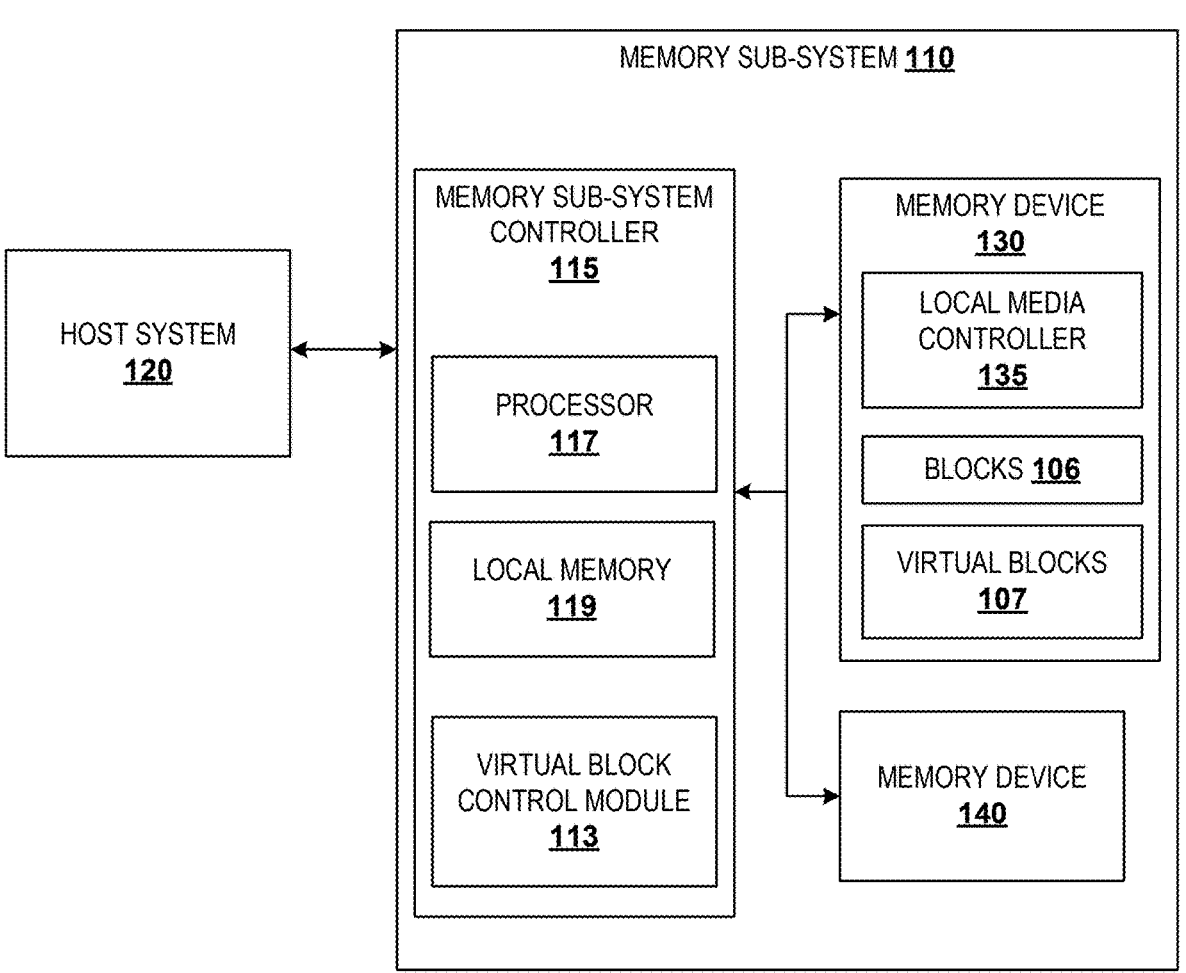

This disclosure relates to memory devices, and particularly to a selective media scanning for a virtual block. A manner of performing a media scan on a virtual block is described herein. As described herein, to provide a media scan (e.g., also referred to herein and elsewhere as "media scan" or "reliability scan") of a virtual block, one or more codewords of a single fractional good block are selected for the media scan operation based on a relative read count between all of the fractional good blocks of the virtual block. As described herein, the term "virtual block" refers to a logically connected set of fractional good blocks that are provided from two or more separate physical blocks. As described herein, the term "fractional good block" refers to a deck or set of decks that are operational on a physical block, with the physical block also including a deck or set of decks that are defective, and thus non-operational. The term "half good block (HGB)" is used frequently herein to describe an operational deck on a physical block, with the physical block also including another deck that is non-operational. However, the term "fractional good block" can also refer to an operational deck on a physical block that includes more than two decks (e.g., three decks ("third good block (TGB)") or more).

Every time a physical block of memory is read, a high amplitude read voltage pulse is applied to the physical block. Over a large quantity of read operations, the high amplitude read pulses can result in read disturb (RD) stress and read disturb charge loss (RDCL), each of which can deleteriously affect read performances of the memory cells. For example, RD stress can alter the voltage thresholds of a memory cells (e.g., particularly at level zero), thereby resulting in a greater error rate in the data that is read from the memory cells. As another example, RDCL can result in distortion and decrease of charge distributions of voltage thresholds at higher voltage levels (e.g., levels six and seven).

For a physical block that includes multiple decks, each of the decks can exhibit the effects of RD stress and/or RDCL, even if one of the decks experiences significantly more read operations than the other(s). In other words, the high amplitude read pulses provided to one deck of a physical block can degrade the operation of the entire physical block, and can thus affect the entire physical block with respect to RD stress and/or RDCL. However, because a virtual block is composed of decks from different physical blocks, and thus multiple fractional good blocks, read operations performed on the virtual block can result in uneven amounts of RD stress and/or RDCL between the different fractional good blocks of the virtual block. In other words, if one of the fractional good blocks experiences significantly greater read operations than the other fractional good block(s), the respective fractional good block can have a corresponding significantly greater RD stress and/or RDCL than the other fractional good block(s). Such disparate effects of RD stress and/or RDCL can result in uneven read characteristics between the fractional good blocks of the virtual block.

To account for disparate amounts of RD stress and/or RDCL between the fractional good blocks, the controller can provide a selective media scan operation on the virtual block based on the quantity of read operations performed on the fractional good blocks of the virtual block. For example, every time a read operation is performed on a virtual block, a controller can increment a read counter for the fractional good block that is read. As an example, the read counter can be associated with the physical block that includes the fractional good block. The controller can also increment a total read counter when data from either of the fractional good blocks is read. The controller can thus first determine whether to perform a media scan operation if a total count value of the total read counter exceeds a threshold. During the media scan, the controller can determine which fractional good block has a highest count value. If the highest count value does not exceed a selective scan threshold, the controller can select wordline(s) from an arbitrary of the fractional good blocks for performing the media scan operation. As described herein, the term "arbitrary" and "arbitrarily" with respect to selection of a fractional good block refers to selection of a fractional good block based on a default and/or random routine selection. Therefore, arbitrary selection of a fractional good block corresponds to selection of the fractional good block without including additional selection-based commands to execute the media scan. If the highest count value exceeds the selective scan threshold, then the controller can select wordline(s) from the respective fractional good block having the highest count value on which to perform the media scan operation. In this manner, the controller can treat the virtual block as having an overall health based on the least reliable one of the fractional good blocks to accommodate a worst-case scenario for treating future read and/or write operations of the virtual block, thereby mitigating errors in the data stored therein.

A memory sub-system refers to a storage device, a memory module or some combination thereof. The memory sub-system includes a memory device or multiple memory devices that store data. The memory devices could be volatile or non-volatile memory devices. Some examples of a memory sub-system include high density non-volatile memory devices where retention of data is desired during intervals of time where no power is supplied to the memory device. One example of a non-volatile memory device is a not-AND (NAND) memory device. A non-volatile memory device is a package that includes a die(s). Each such die can include a plane(s). For some types of non-volatile memory devices (e.g., NAND memory devices), each plane includes a set of physical blocks, and each physical block includes a set of pages. Each page includes a set of memory cells, which are commonly referred to as cells. A cell is an electronic circuit that stores information. A cell stores one or more bits of binary information and has various logic states that correlate to the number of bits being stored. The logic states are be represented by binary values, such as 'O' and '1', or as combinations of such values, such as '00', '01', '10' and '11'.

A memory device includes multiple cells arranged in a two-dimensional or a three-dimensional array. In some examples, memory cells are formed on a silicon wafer in an array of columns connected by conductive lines (also referred to as bitlines, or BLs) and rows connected by conductive lines (also referred to as wordlines or WLs). A wordline is a row of associated memory cells in a memory device that are used with a bitline or multiple bitlines to generate the address of each of the memory cells. The intersection of a bitline and a wordline defines an address of a given memory cell.

A block refers to a unit of the memory device used to store data. In various examples, the unit could be implemented as a group of memory cells, a wordline group, a wordline or as individual memory cells. Multiple blocks are grouped together to form separate partitions (e.g., planes) of the memory device to enable concurrent operations to take place on each plane. A solid-state drive (SSD) is an example of a memory sub-system that includes a non-volatile memory device(s) and a memory sub-system controller to manage the non-volatile memory devices.

When data is stored in memory, certain algorithms can detect and correct a number of errors in the stored data. Error correction code (ECC) encodes data in such a way that errors in the data can be identified and corrected when the data is decoded. For example, data strings can be encoded by an ECC encoder by adding a number of redundant and/or parity bits to create corresponding codewords. When an original data string is to be retrieved from the memory, an ECC decoder can use the corresponding codewords to identify bit errors in the encoded data string. If bit errors are present, one or more ECC operations can be employed to correct the bit errors and to recover the original data string. In addition to outputting error-checked and/or error-corrected data, some implementations of the ECC can also generate metadata regarding an ECC decode operation.

As described herein, a memory sub-system can generate quality metrics corresponding to an ECC operation. The quality metrics can be generated and collected in a media scan of the memory device, and not only when a memory device is performing a host-initiated read operation. The media scan can involve read and ECC operations that iteratively generate quality metrics corresponding to memory regions in a memory device to build up a data set that can illustrate the health of the device. As an example, the media scan operation can run in the background of a memory system and/or device (e.g., as a background scan periodically and/or during idle periods in which the memory system and/or the memory device is not performing other operations in response to a host-initiated command). In other examples, a media scan operation can be performed as a foreground operation of a memory system and/or device (e.g., in response to a host-initiated command or according to a predetermined schedule).

The media scan operation can iteratively read a number of pages in each memory region. During the scan, problematic and/or unreliable memory regions (e.g., memory regions with a high bit error count and/or a low margin to failure) can be identified (e.g., before a memory region fails and/or enters redundant array of independent NAND (RAIN) recovery) and can be refreshed and/or retired. In some examples, a media scan operation can classify a memory region as unreliable based at least in part on quality metrics generated while decoding codewords saved to the memory region. For example, comparing a codeword's BEC to a defined codeword BEC threshold can provide an indication of whether the memory region saving the codeword is reliable (e.g., even though an original data string corresponding to the codeword can currently be reconstructed and/or recovered). In these and other examples, the quality metrics generated while decoding a codeword and/or statistical information corresponding thereto can be saved (e.g., for analysis of the memory system and/or device, for use in other error avoidance BCC operations, etc.). In these and still other examples, a log of refreshed and/or retired memory regions can be saved and/or maintained (e.g., for analysis of the memory system and/or device).

In this manner, memory systems and/or devices with media scan capability can proactively identify least capable memory regions within the systems and/or devices to prevent them from becoming a trigger rate problem and/or causing an uncorrectable ECC event. Thus, memory systems and/or devices with media scan capability are expected to mitigate outlier BEC tail surprises that may be exacerbated by NAND die intolerance to retention, read disturb, cross-temperature, and/or defects. The memory systems and/or devices are also expected to save and/or provide valuable information regarding the health and/or quality of the systems and/or devices.

To perform a media scan operation, the memory sub-system controller can iteratively scan each of the codewords of a given page of memory to determine the BEC of each of the codewords. Thus, the BEC of each of the codewords can be compared with a BEC threshold. If the BEC of one or more of the codewords of the page exceeds the BEC threshold, then the memory sub-system controller can fold the data to a different location in the memory device. However, the health of a given physical location of memory can be substantially consistent within a group of proximal locations, particularly if the memory locations are logically connected (e.g., part of the same page, sub-block, or block).

Therefore, if a given codeword fails a media scan operation and is deemed unreliable (e.g., by having a BEC that exceeds the BEC threshold), then it is likely that the other codewords of the respective page of memory are likewise unreliable.

As described herein, the controller can account for disparate amounts of RD stress and/or RDCL between the fractional good blocks by providing a selective media scan operation on the virtual block based on the quantity of read operations performed on the fractional good blocks of the virtual block. During the media scan, the controller can determine which fractional good block has a highest count value. If the highest count value does not exceed a selective scan threshold, the controller can select wordline(s) from an arbitrary one of the fractional good blocks for performing the media scan operation. If the highest count value exceeds the selective scan threshold, then the controller can select wordline(s) from the respective fractional good block having the highest count value on which to perform the media scan operation. In this manner, the controller can treat the virtual block as having an overall health based on the least reliable one of the fractional good blocks to accommodate a worst-case scenario for treating future read and/or write operations of the virtual block, thereby mitigating errors in the data stored therein.

FIG. 1A illustrates a system 100 that includes a memory sub-system 110 that can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card and a hard disk drive (HDD). Examples of memory modules include a dual in-line memory module (DIMM), a small outline DIMM (SO-DIMM) and various types of non-volatile dual in-line memory modules (NVDIMMs).

The system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment or a networked commercial device) or such computing device that includes memory and a processing device. The system 100 can include a host system 120 that is coupled to one or more memory sub-systems 110. In some examples, the host system 120 is coupled to different types of the memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller, CXL controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a compute express link (CXL) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory device(s) 130) when the memory sub-system 110 is coupled with the host system 120 by the physical host interface (e.g., PCIe or CXL bus). The physical host interface can provide an interface for passing control, address, data and other signals between the memory sub-system 110 and the host system 120. FIG. 1A illustrates a memory sub-system 110 as an example. In general, the host system 120 can access multiple memory sub-systems via a same communication connection, multiple separate communication connections and/or a combination of communication connections.

The memory device 130 and the memory device 140 are implemented as non-transitory computer readable media. The memory device 130 and the memory device 140 can include any combination of the different types of non-volatile memory devices and/or volatile memory devices. The volatile memory devices (e.g., the memory device 140) can be, but are not limited to, random access memory (RAM), such as dynamic random access memory (DRAM) and synchronous dynamic random access memory (SDRAM).

Some examples of non-volatile memory devices (e.g., memory device(s) 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory device(s) 130 include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) or higher, can store multiple bits per cell. In some examples, each of the memory device(s) 130 can include one or more arrays of memory cells such as SLCs, MLCs, TLCs, QLCs, PLCs, or some combination thereof. In some examples, a particular memory device can include an SLC portion, an MLC portion, a TLC portion, QLC portion, and/or a PLC portion of memory cells. The memory cells of the memory device(s) 130 can be grouped as pages that can refer to a logical unit of the memory device used to store data. In some types of memory (e.g., NAND), pages can be grouped to form blocks 106. The blocks 106 can include sub-blocks, and can be organized across a set of planes of the memory device 130.

As an example, a block (sometime referred to herein as "physical block") 106 of the memory device 130 according to the present disclosure has at least two decks. A functional deck refers to a deck that satisfies criteria pertaining to a functionality of the deck. For example, the criteria can include that a metric of the deck (e.g., an average RBER) does not exceed a threshold value that is considered as an indication of a normal function of the deck. A defective deck refers to a deck that does not satisfy the criteria pertaining to the functionality of the deck. For example, the metric of the deck (e.g., an average RBER) does not exceed a threshold value that is considered as an indication of a normal function of the deck. The criteria used for the functional deck and the defective deck can be the same or different. In some implementations, a defective deck may be identified by program status failure.

A block 106 can be described as a full good block, which thus refers to a block 106 in which all of the decks are functional decks. A defective block 106 refers to a block that has only defective decks. However, as described herein, some physical blocks 106 can include both a functional deck and a defective deck. Such a physical block 106 therefore includes one or more fractional good blocks, such as a half good block (HGB) in an example of a physical block 106 that includes one functional deck and one defective deck. To improve yield and reduce costs in the memory device 130, one or more fractional good blocks of the blocks 106 can be logically combined to form virtual blocks 107 that operate substantially the same as a full good block 106 with respect to storing data, as well as read and write operations.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide-based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM), etc.

A memory sub-system controller 115 (or controller 115 for simplicity) communicates with the memory device(s) 130 to perform operations such as reading data, writing data or erasing data at the memory device(s) 130 and other such operations. The memory sub-system controller 115 can include hardware such as one or more integrated circuits and/or discrete components, a buffer memory or some combination thereof. The hardware can include a digital circuitry with dedicated (e.g., hard-coded) logic to perform the operations described herein. The memory sub-system controller 115 can be a microcontroller, special purpose logic circuitry (e.g., a field programmable gate array (FPGA), an application specific integrated circuit (ASIC), etc.) or another suitable processor.

The memory sub-system controller 115 can include a processing device, which includes one or more processors (e.g., the processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120. The local memory 119 is a non-transitory computer-readable medium.

In some examples, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another example, a memory sub-system 110 does not include a memory sub-system controller 115 and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device(s) 130. The memory sub-system controller 115 can be responsible for other operations such as wear leveling operations, garbage collection operations, error detection and error-correcting code (ECC) operations, encryption operations, caching operations and address translations between a logical address (e.g., a logical block address (LBA), namespace) and a physical address (e.g., physical block address) that are associated with the memory device(s) 130. The memory sub-system controller 115, for example, may employ a Flash Translation Layer (FTL) to translate logical addresses to corresponding physical memory addresses, which can be stored in one or more FTL mapping tables. In some instances, the FTL mapping table can be referred to as a logical-to-physical (L2P) mapping table storing L2P mapping information. The memory sub-system controller 115 can further include host interface circuitry to communicate with the host system 120 via the physical host interface. The host interface circuitry can convert the commands received from the host system into command instructions to access the memory device(s) 130 as well as convert responses associated with the memory device(s) 130 into information for the host system 120.

The memory sub-system 110 can also include additional circuitry or components that are not illustrated. For example, the memory sub-system 110 can include a cache or buffer (e.g., DRAM) and address circuitry (e.g., a row decoder and a column decoder) that can receive an address from the memory sub-system controller 115 and decode the address to access the memory device(s) 130.

In some examples, the memory device(s) 130 include local media controllers 135 that operate in concert with the memory sub-system controller 115 to execute operations on one or more memory cells of the memory device(s) 130. An external controller (e.g., the memory sub-system controller 115) can externally manage the memory device 130 (e.g., perform media management operations on the memory device 130). In some examples, the memory sub-system 110 is a managed memory device, which is a raw memory device 130 having control logic (e.g., local media controller 135) on the die and a controller (e.g., the memory sub-system controller 115) for media management within the same memory device package. An example of a managed memory device is a managed NAND (MNAND) device.

In operation, the host system 120 manages and controls the flow of data between itself and the memory sub-system 110, ensuring efficient data storage and retrieval operations. More generally, the host system 120 employs the memory sub-system 110 to write data to and read data from the memory sub-system 110. For instance, the host system 120 processes these request for reading and/or write data by interacting with the memory sub-system 110, managing the flow of data to and from the memory device 130 and/or the memory device 140 within the memory sub-system 110.

This reading and writing of data enables operation of computing systems where data access and management is needed.

In various examples, the memory sub-system 110 includes a virtual block control module 113 that can periodically monitor the health of the memory device 130 and the reliability of the data stored therein. In some examples, the memory sub-system controller 115 includes at least a portion of the virtual block control module 113. In some examples, the virtual block control module 113 is part of the host system 120, an application or an operating system. In other examples, local media controller 135 includes a portion of the virtual block control module 113 and is configured to perform the functionality described herein.

The virtual block control module 113 can be configured to monitor a state of health of the virtual blocks 107 via selective media scan operations, as described herein. The virtual block control module 113 can account for disparate amounts of read disturb (RD) stress and/or read disturb charge loss (RDCL) between the fractional good blocks that form the virtual blocks 107 in providing the media scan operations of the virtual blocks 107. As described herein, the virtual block control module 113 can provide a selective media scan operation on the virtual blocks 107 based on the quantity of read operations performed on the fractional good blocks of the virtual blocks 107.

For example, every time a read operation is performed on a virtual block 107, the virtual block control module 113 can increment one or more counters 118. The counters 118 can include a read counter for the fractional good block that is read from the virtual block 107. As an example, the read counter can be associated with the physical block that includes the fractional good block. The virtual block control module 113 can also increment a total read counter when data from either of the fractional good blocks is read. The virtual block control module 113 can thus first determine whether to perform a media scan operation if a total count value of the total read counter exceeds a threshold. During the media scan operation, the virtual block control module 113 can determine which fractional good block of the virtual block 107 has a highest count value. If the highest count value does not exceed a selective scan threshold, the virtual block control module 113 can select wordline(s) from an arbitrary one of the fractional good blocks of the virtual block 107 for performing the media scan operation. If the highest count value exceeds the selective scan threshold, then the virtual block control module 113 can select wordline(s) from the respective fractional good block of the virtual block 107 having the highest count value on which to perform the media scan operation.

In this manner, as described herein, the virtual block control module 113 can account for disparate health/reliability of the fractional good blocks of the virtual block 107 for purposes of selection of one of the fractional good blocks for performing a media scan operation, as opposed to arbitrarily selecting one of the fractional good blocks for performing a media scan operation. Accordingly, the virtual block control module 113 can treat the virtual block 107 as having an overall health based on the least reliable one of the fractional good blocks of the respective virtual block 107 to accommodate a worst-case scenario for treating future read and/or write operations of the virtual block 107, thereby mitigating errors in the data stored therein.

Figure 1B:
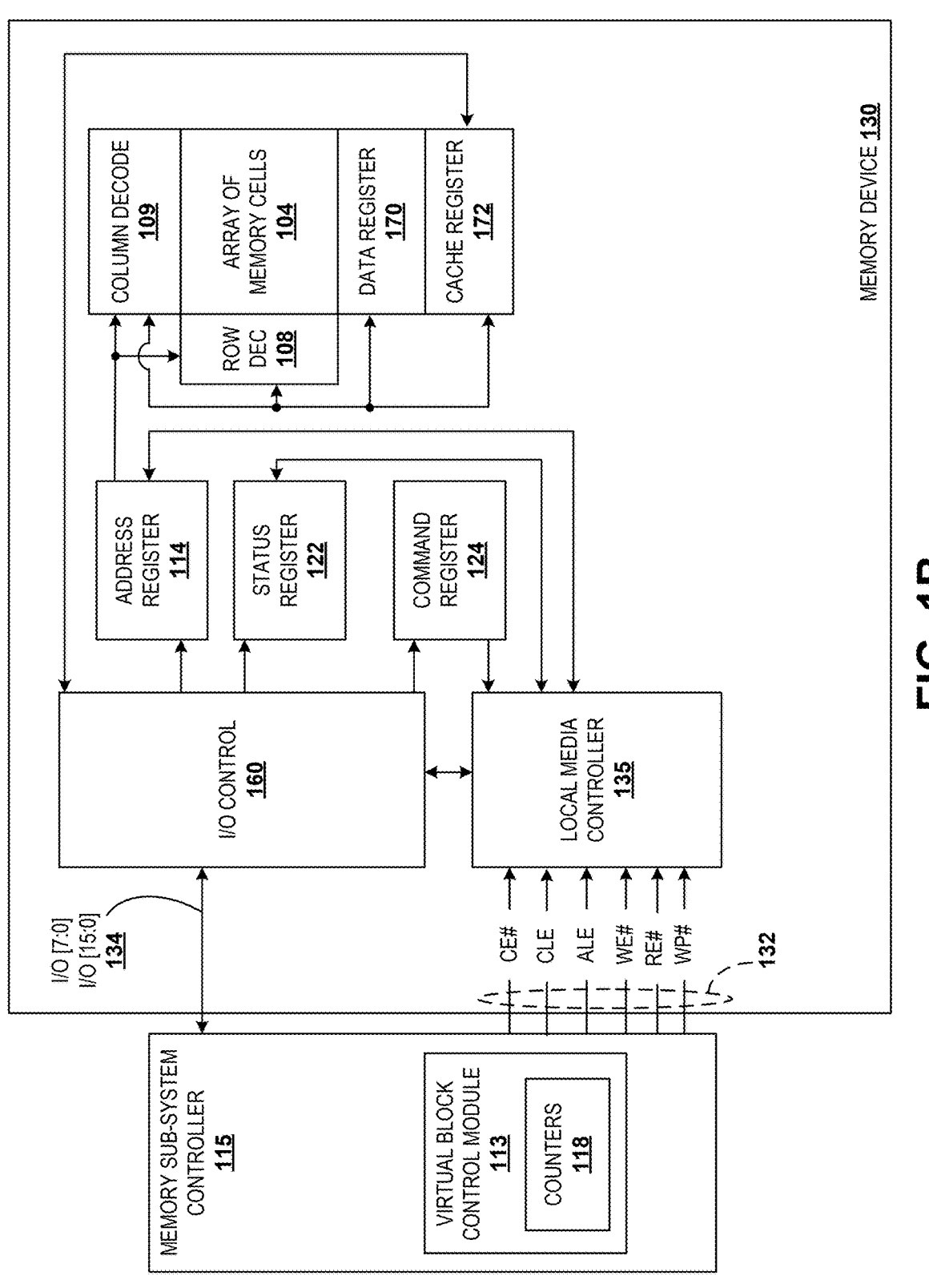
FIG. 1B illustrates a simplified block diagram of an example memory device in communication with a memory sub-system controller.

FIG. 1B illustrates a simplified block diagram of an example of a first apparatus, in the form of a memory device 130, in communication with an example of a second apparatus, in the form of a memory sub-system controller 115 of a memory sub-system (e.g., the memory sub-system 110 of FIG. 1A). Some examples of electronic systems include personal computers, personal digital assistants (PDAs), digital cameras, digital media players, digital recorders, games, appliances, vehicles, wireless devices, mobile telephones, etc. The memory sub-system controller 115 (e.g., a controller external to the memory device 130), can be a memory controller or other external host device.

The memory device 130 includes an array of memory cells 104 logically arranged in rows and columns. As an example, the memory cells 104 can be arranged in an assortment of multiple blocks, with each block including a set of sub-blocks. The blocks/sub-blocks are grouped together to form the planes of the memory device 130. The memory cells 104 form a non-transitory computer-readable medium. Memory cells of a logical row are connected to the same access line (e.g., a wordline) while memory cells of a logical column are selectively connected to the same data line (e.g., a bit line) in some examples. In some examples, a single access line is associated with more than one logical row of memory cells and a single data line may be associated with more than one logical column. Memory cells of at least a portion of the array of memory cells 104 are capable of being programmed to one of at least two target data states.

The memory device 130 includes row decode circuitry 108 and column decode circuitry 109 for decoding address signals. Address signals are received and decoded to access an array of memory cells 104 of the memory device 130. The memory device 130 also includes input/output (I/O) control circuitry 160 to manage input of commands, addresses and data to the memory device 130 as well as output of data and status information from the memory device 130. The memory device 130 has an address register 114 and is in communication with the I/O control circuitry 160, the row decode circuitry 108 and the column decode circuitry 109 to latch the address signals prior to decoding. The memory device 130 also includes a command register 124 in communication with the I/O control circuitry 160 and a local media controller 135 to latch incoming commands.

A controller (e.g., the local media controller 135 internal to the memory device 130) controls access to the array of memory cells 104 in response to the commands and generates status information for the external memory sub-system controller 115. For example, the local media controller 135 is configured to perform access operations (e.g., read operations, programming operations and/or erase operations) on the array of memory cells 104. The local media controller 135 is in communication with the row decode circuitry 108 and the column decode circuitry 109 to control the row decode circuitry 108 and the column decode circuitry 109 in response to the addresses.

As described above in the example of FIG. 1A, the virtual block control module 113 can implement a selective media scan operation on the memory cells 104 of the memory device 130 that are organized into the virtual blocks 107. The media scan operation can be implemented on a selected fractional good block of a respective virtual block 107 of the memory device 130 based on the count values of read counters associated with the respective virtual block 107. As described above, the count values of the read counters can be compared with a selective scan threshold to determine which of the fractional good blocks to select for the media scan operation.

The local media controller 135 is also in communication with a cache register 172. The cache register 172 latches data, either incoming or outgoing, as directed by the local media controller 135 to temporarily store data while the array of memory cells 104 is busy writing or reading, respectively, other data. During a programming operation (e.g., write operation), data is passable from the cache register 172 to the data register 170 for transfer to the array of memory cells 104, and new data can be latched in the cache register 172 from the I/O control circuitry 160. During a read operation, data is passable from the cache register 172 to the I/O control circuitry 160 for output to the memory sub-system controller 115. New data is passable from the data register 170 to the cache register 172. The cache register 172 and/or the data register 170 form (e.g., or form a portion of) a page buffer of the memory device 130. The page buffer includes sensing devices (not shown in FIG. 1B) to sense a data state of a memory cell of the array of memory cells 104. For example, the sensing devices sense a state of a data line connected to that memory cell. The memory device 130 also includes a status register 122 in communication with the I/O control circuitry 160 and the local media controller 135 to latch the status information for output to the memory sub-system controller 115.

The memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE # and/or a write protect signal WP #. Additional or alternative control signals (not shown) can be further received over control link 132 depending upon the nature of the memory device 130. In some examples, the memory device 130 receives command signals (which represent commands), address signals (which represent addresses) and data signals (which represent data) from the memory sub-system controller 115 over a multiplexed input/output (I/O) bus 134 and outputs data to the memory sub-system controller 115 over the I/O bus 134.

In some examples, the commands are received over input/output (I/O) pins [7:0] of the I/O bus 134 at I/O control circuitry 160 and may then be written into the command register 124. The addresses are received over input/output (I/O) pins [7:0] of the I/O bus 134 at I/O control circuitry 160 and written into the address register 114. The data is receivable over input/output (I/O) pins [7:0] for an 8-bit device or input/output (I/O) pins [15:0] for a 16-bit device at I/O control circuitry 160 and is writable into the cache register 172. The data is subsequently written into the data register 170 for programming the array of memory cells 104 in some examples.

In some examples, the cache register 172 is omitted, and in such examples, the data is written directly into the data register 170. Additionally or alternatively, data is output over input/output (I/O) pins [7:0] for an 8-bit device or input/output (I/O) pins [15:0] for a 16-bit device. Moreover, it is noted that although reference is made to I/O pins, in other examples, a different conductive node providing for electrical connection to the memory device 130 by an external device (e.g., the memory sub-system controller 115), such as conductive pads or conductive bumps could be used in addition to or as a replacement for the I/O pins.

The example memory device 130 of FIG. 1B has been simplified. Moreover, in other examples, the functionality of the various block components described with reference to FIG. 1B are not segregated to distinct components or component portions of an integrated circuit device. For example, a single component or component portion of an integrated circuit device could be adapted to perform the functionality of more than one block component of FIG. 1B. Alternatively, components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) are useable in various examples.

Figure 2:
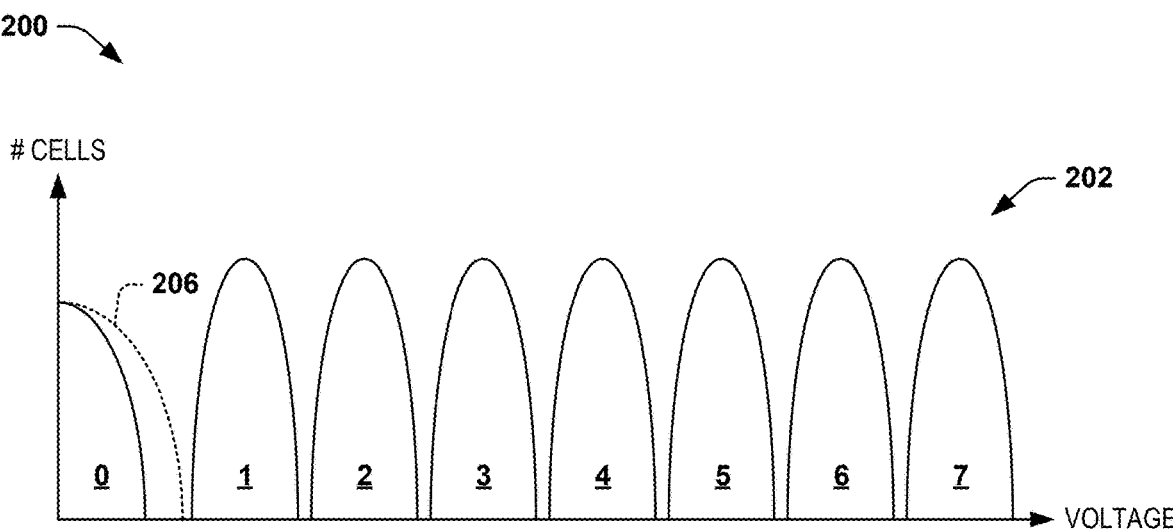
FIG. 2 illustrates an example diagram of voltage graphs for reading data.
Figure 2:
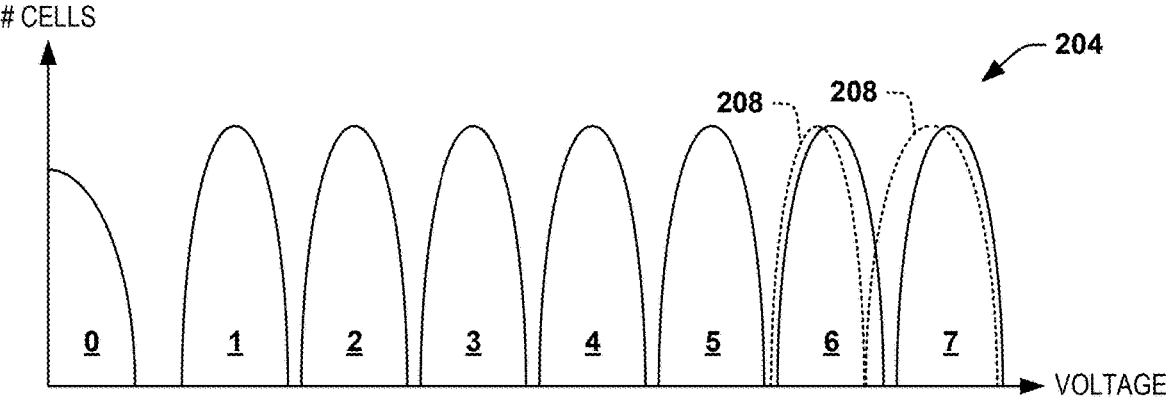

FIG. 2 illustrates an example diagram 200 of voltage graphs for reading data. The diagram 200 demonstrates a first voltage graph 202 and a second voltage graph 204. As an example, the voltage graphs 202 and 204 can correspond to read voltage levels (e.g., threshold voltages) for reading data from memory cells of the memory device 130 over a quantity of memory cells to be read. The read voltage levels can correspond to programmed states of the array of memory cells 104 of the memory device 130. The example shown in FIG. 2 represents three-bit, e.g., eight-state, memory cells. Therefore, the voltage levels represent eight target states to which the memory cells can be programmed. In the example of FIG. 2, the eight target states are labeled zero through seven (0-7).

As described above, every time a physical block 106 of the memory device 130 is read, a high amplitude read voltage pulse is applied to the physical block 106. Over a large quantity of read operations, the high amplitude read pulses can result in read disturb (RD) stress and read disturb charge loss (RDCL), each of which can deleteriously affect read performances of the memory cells 104.

For example, RD stress can alter the voltage thresholds of a memory cells, thereby resulting in a greater error rate in the data that is read from the memory cells. The first voltage graph 202 demonstrates the effects of RD stress. In the first voltage graph 202, the voltage of level 0 is demonstrated as shifting to a higher amplitude, demonstrated by the dotted line at 206. The shift of the voltage threshold of level 0 (e.g., and other lower levels) can cause bit errors during a read operation of the respective memory cell 104.

As another example, RDCL can result in distortion and decrease of charge distributions of voltage thresholds at higher voltage levels. The second voltage graph 204 demonstrates the effects of RDCL. In the second voltage graph 204, the respective voltages of levels 6 and 7 are demonstrated as shifting to a lower amplitude resulting from charge loss, demonstrated by the dotted line at 208. The shift of the voltage thresholds of levels 6 and 7 (e.g., and other higher levels) can also cause bit errors during a read operation of the respective memory cell 104. Additionally, the effects of RDCL can be more prominent at higher temperatures, thus introducing a temperature component into efforts to mitigate the deleterious effects of RDCL.

Figure 3A:
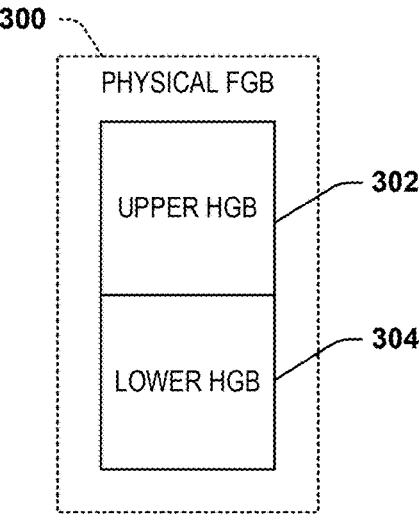
FIG. 3A illustrates an example diagram of a physical data block.

FIG. 3A illustrates an example diagram of a physical data block 300. The physical block ("PHYSICAL FGB") 300 can correspond to a physical block 106 in the memory device 130. In the example of FIG. 3A, the physical block 300 is a full good block (FGB) that includes a first deck that is a functional upper half good block (HGB) 302 and a second deck that is a functional lower HGB 304. Because the HGBs 302 and 304 are both functional, the memory sub-system controller 115 can implement read and write operations on either of the HGBs 302 and 304. Additionally, because a high number of read pulses provided to one of the HGBs 302 and 304 can degrade the operation of the entire physical block 300, the memory sub-system controller 115 can arbitrarily select one of the HGBs 302 and 304 to provide a media scan operation on the wordline(s) therein. Additionally, the read pulses provided to one of the HGBs 302 and 304 affects the entire physical block, and thus the other one of the HGBs 302 and 304, with respect to RD stress and/or RDCL. Therefore, both of the HGBs 302 and 304 of the physical FGB 300 can approximately equally exhibit the effects of RD stress and/or RDCL, even if one of the HGBs 302 and 304 experiences significantly more read operations than the other.

Figure 3B:
FIG. 3B illustrates an example diagram of generating a virtual data block.
Figure 3B:
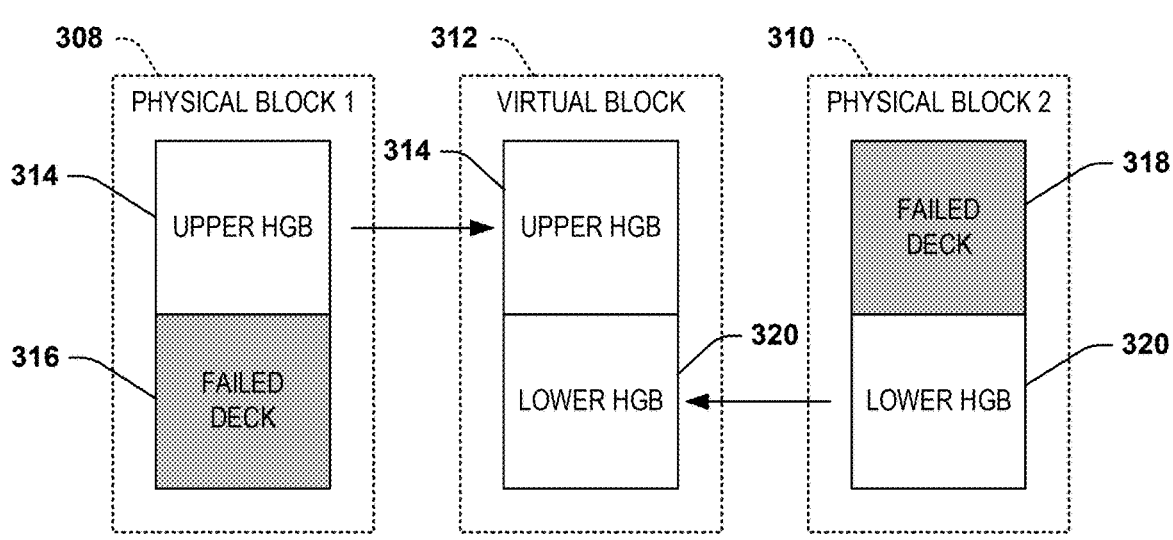

FIG. 3B illustrates an example diagram 306 of generating a virtual block. The diagram 306 includes a physical block ("PHYSICAL BLOCK 1") 308, a physical block ("PHYSICAL BLOCK 2") 310, and a virtual block ("VIRTUAL BLOCK") 312. The physical blocks 308 and 310 each can correspond to a physical block 106 in the memory device 130, and the virtual block 312 can correspond to one of the virtual blocks 107 in the memory device 130.

In the example of FIG. 3B, the physical block 308 includes a first deck that is a functional upper HGB 314 and a second deck that is a non-functional defective ("FAILED") deck 316. Similarly, the physical block 310 includes a first deck that is a non-functional defective ("FAILED") deck 318 and a functional lower HGB 320. In order to optimize resources on the memory device 130, the first and second physical blocks 308 and 310 can be logically merged to form the virtual block 312. In the example of FIG. 3B, the upper HGB 314 and the lower HGB 320 can form the two decks of the virtual block 312, such that the virtual block 312 can operate substantially the same as the physical FGB 302.

However, because the virtual block 312 is composed of two decks from the respective different physical blocks 308 and 310, read operations performed on the virtual block 312 can result in uneven amounts of RD stress and/or RDCL between the different HGBs 314 and 320 of the virtual block 312. In other words, if one of the HGBs 314 and 320 experiences significantly greater read operations than the other one of the HGBs 314 and 320, the respective one of the HGBs 314 and 320 can have a corresponding significantly greater RD stress and/or RDCL than the other one of the HGBs 314 and 320. Such disparate effects of RD stress and/or RDCL can result in uneven read characteristics between the HGBs 314 and 320 of the virtual block 312.

Figure 4A:
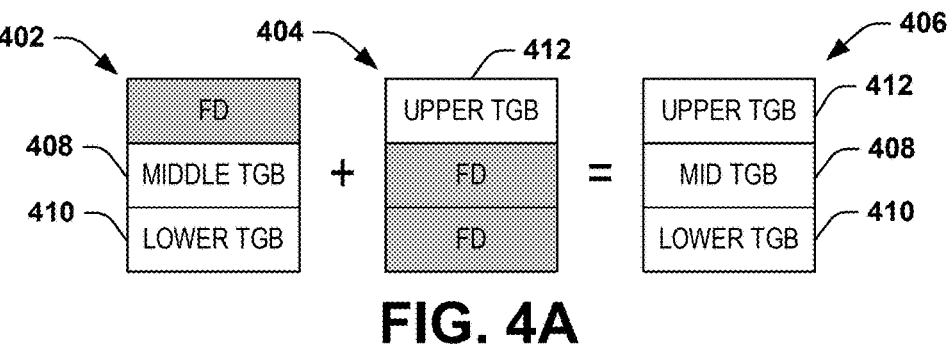
FIG. 4A illustrates another example diagram of generating a virtual data block.
Figure 4B:
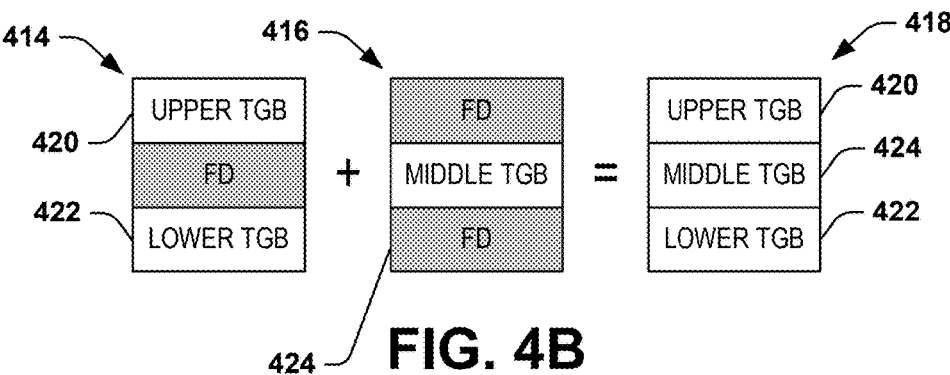
FIG. 4B illustrates another example diagram of generating a virtual data block.
Figure 4C:
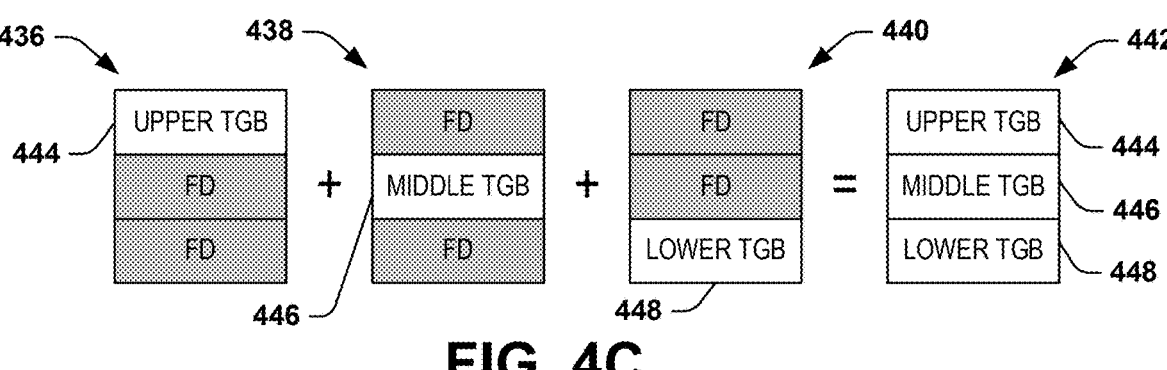
FIG. 4C illustrates another example diagram of generating a virtual data block.

FIGS. 4A through 4C illustrate additional examples of data blocks. The diagram 400 demonstrates a set of generated virtual blocks. In the example of FIGS. 4A through 4C, each of the blocks includes three decks instead of the two decks demonstrated in the example of FIGS. 3A and 3B.

FIG. 4A includes a first physical block 402 combined with a second physical block 404 to generate a virtual block 406. The first physical block 402 includes a failed upper deck, a middle third good block (TGB) 408, and a lower TGB 410. The second physical block 404 includes an upper TGB 412, a failed middle deck, and a failed lower deck. The virtual block 406 thus includes an upper TGB 412, a middle TGB 408, and a lower TGB 410.

FIG. 4B includes a first physical block 414 combined with a second physical block 416 to generate a virtual block 418. The first physical block 414 includes an upper TGB 420, a failed middle deck, and a lower TGB 422. The second physical block 416 includes a failed upper deck, a middle TGB 424, and a failed lower deck. The virtual block 418 thus includes an upper TGB 420, a middle TGB 424, and a lower TGB 422.

FIG. 4C includes a first physical block 436 combined with a second physical block 438 combined with a third physical block 440 to generate a virtual block 442. The first physical block 414 includes an upper TGB 444, a failed middle deck, and a failed lower deck. The second physical block 416 includes a failed upper deck, a middle TGB 446, and a failed lower deck. The third physical block 440 includes a failed upper deck, a failed middle deck, and a lower TGB 448. The virtual block 442 thus includes an upper TGB 444, a middle TGB 446, and a lower TGB 448.

Therefore, the diagram 400 demonstrates different variations of virtual blocks based on combinations of physical blocks. The example of FIGS. 4A through 4C are not limiting, such that other combinations of TGBs and failed decks are possible, as well as other quantities of decks in a given fractional good block.

Figure 5:
FIG. 5 illustrates a diagram of a data read operation.
Figure 5:
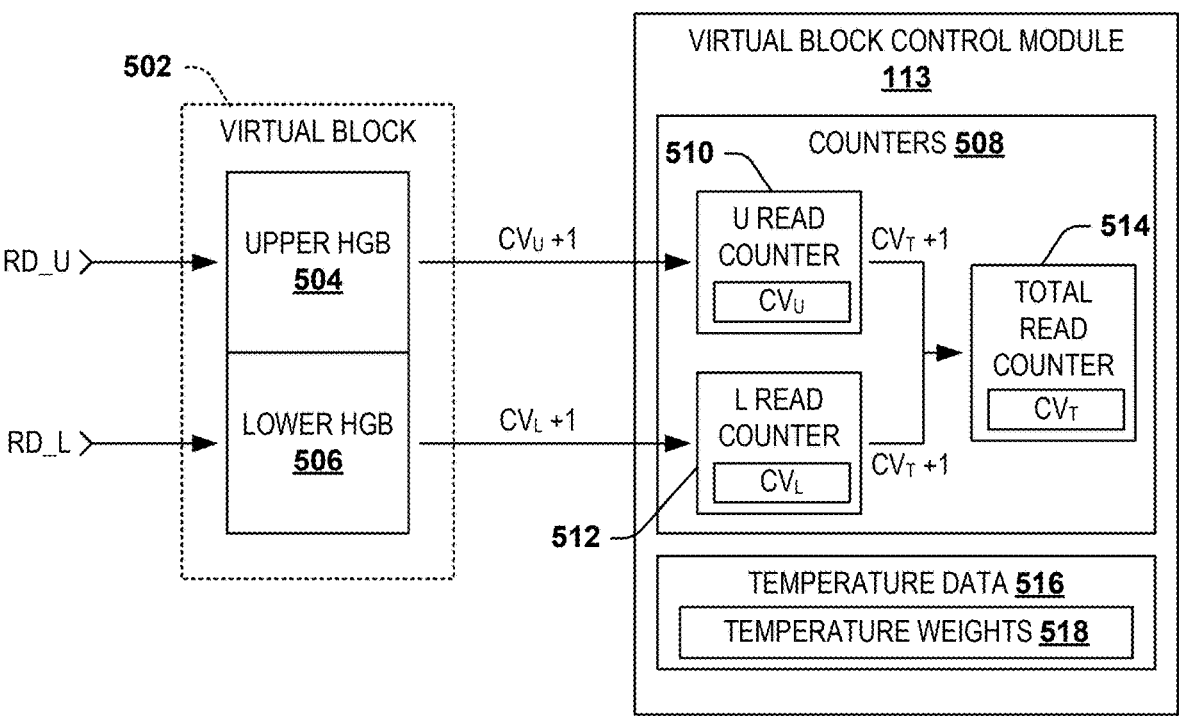

FIG. 5 illustrates a diagram 500 of a data read operation. The diagram 500 demonstrates a virtual block 502 and the virtual block control module 113. The virtual block 502 includes an upper HGB 504 and a lower HGB 506. The upper HGB 504 is demonstrated as receiving a first read operation (e.g., a read voltage pulse) RD_U, and the lower HGB 506 is demonstrated as receiving a second read operation (e.g., a read voltage pulse) RD_L.

The virtual block control module 113 includes a set of counters 508. The counters 508 include an upper read counter ("U READ COUNTER") 510 that maintains an upper read count value $CV_U$. The counters 508 also include a lower read counter ("L READ COUNTER") 512 that maintains a lower read count value $CV_L$. The counters 508 further include a total read counter ("TOTAL READ COUNTER") 514 that maintains a total read count value $CV_T$. In response to a read operation RD_U on the upper HGB 504 of the virtual block 502, the upper read counter 510 increments the upper read count value $CV_U$ by one, demonstrated diagrammatically as "$CV_U$+1" from the upper HGB 504. Similarly, in response to a read operation RD_D on the lower HGB 506 of the virtual block 502, the lower read counter 512 increments the lower read count value $CV_L$ by one, demonstrated diagrammatically as "$CV_L$+1" from the lower HGB 506. In addition, in response to either of the read operations RD_U or RD_L, the total read counter 514 increments the total read count value $CV_T$ by one, demonstrated diagrammatically as "$CV_T$+1" from the upper and lower read counters 510 and 512.

In the example of FIG. 5, the virtual block control module 113 also implements temperature data 516. As an example, the temperature data 516 can include an ambient temperature measurement that can be accessed from another component of the memory device 130 or the memory sub-system controller 115. Alternatively or additionally, the temperature data 516 can be stored locally in the virtual block control module 113. The temperature data 516 can be implemented by the virtual block control module 113 to determine a selective scan threshold against which the count values $CV_U$ and $CV_L$ can be compared, as described herein. Therefore, the effects of temperature can be considered in determining at least the effects of RDCL on the virtual blocks 107 of the memory device 130 during media scan operations, as described herein.

As an example, the consideration of temperature can be provided based on temperature weights 518 that are implemented for determining the selective scan threshold. The temperature weights 518 can be predetermined (e.g., set static in the memory device 130 or dynamically programmable in the memory device 130) and can be accessible by the virtual block control module 113 to determine the selective scan threshold to account for temperature-dependence of RDCL in media scan operations. The temperature weights 518 can correspond to constants that are multiplied with a nominal threshold for determining the selective scan threshold. For example, the nominal threshold can be associated with a difference between the count values $CV_U$ and $CV_L$, and can be either a static value or a dynamic value. As an example, the nominal threshold can correspond to a mathematical average of the count values $CV_U$ and $CV_L$, thereby providing a variable value to the nominal threshold that can be multiplied by one of the temperature weights 518 based on the measured ambient temperature provided in the temperature data 516. One non-limiting example of the temperature weights ("TW") can be expressed in Table 1 as follows:

TABLE 1

| Temp (° C.) | TW |
|---|---|
| <60° | 1.5 |
| 60°-80° | 1.3 |
| >80° | 1.2 |

Therefore, the temperature weights TW in Table 1 can account temperature dependency of RDCL in determining the health of the virtual blocks 107.

Figure 6:
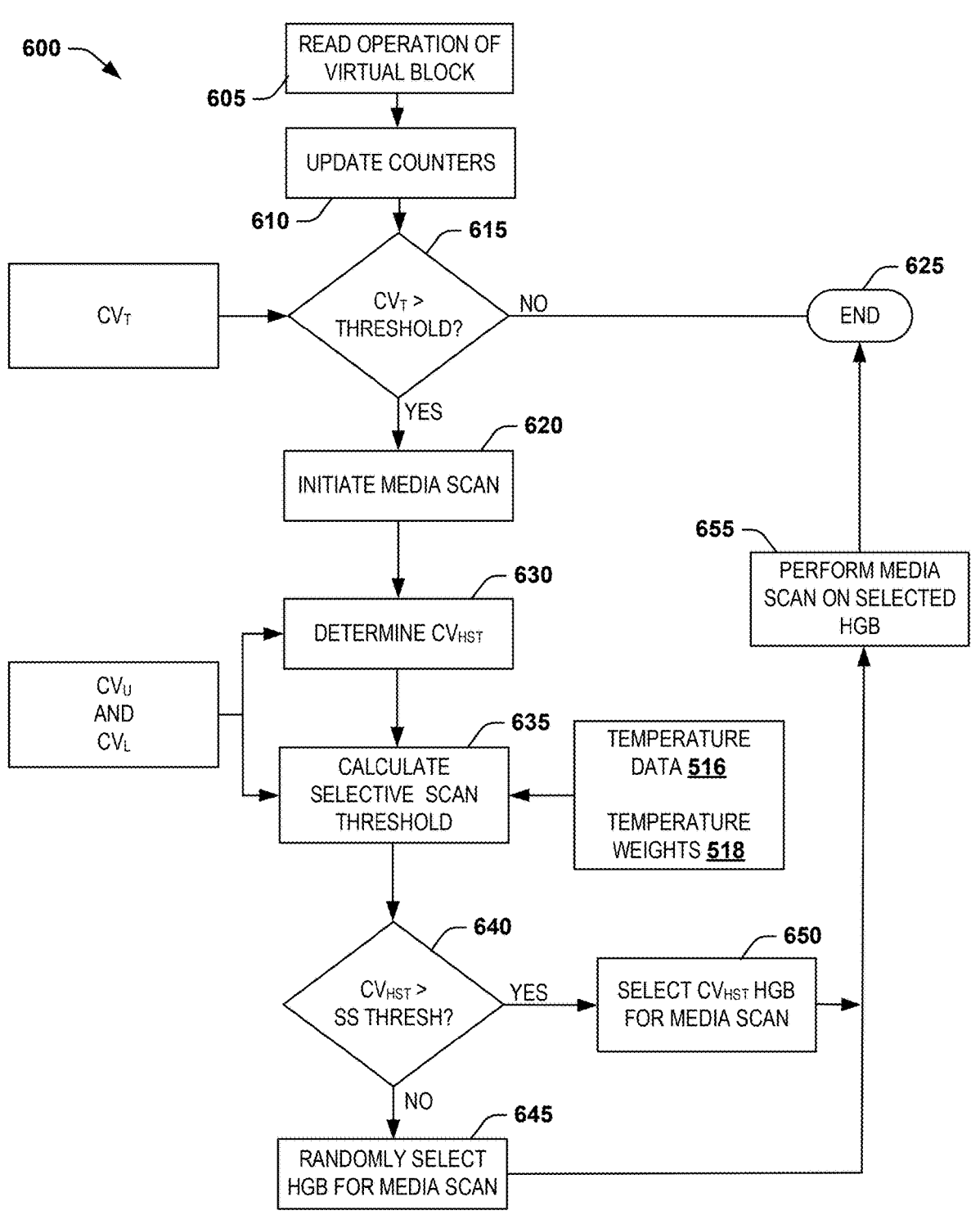
FIG. 6 illustrates an example flow diagram of a method for performing a media scan operation.

FIG. 6 illustrates a flow diagram of a method 600 of performing a media scan operation on a memory device (e.g., the memory device 130). The method 600 can be implemented, for example, by a controller, such as the memory sub-system controller 115 (e.g., the virtual block control module 113) of the system 100 of FIG. 1A. The method 600 can thus correspond to the media scan operation described herein. In the example of FIG. 6, the method 600 describes selection of one of two HGBs of a virtual block 107 for a media scan operation. However, the method 600 can also be applicable to a virtual block 107 with any number of fractional good blocks (e.g., TGBs). The method begins at block 605, in which the controller initiates a read operation of a virtual block 107. The method then proceeds to block 610.

At block 610, the virtual block control module 113 increments the respective counters 508 in response to the read operation. For example, if the read operation is performed on the upper HGB of the virtual block 107, the virtual block control module 113 increments an upper count value $CV_U$ of the upper read counter 510. Similarly, if the read operation is performed on the lower HGB of the virtual block 107, the virtual block control module 113 increments a lower count value $CV_L$ of the lower read counter 512. In either case, the virtual block control module 113 increments a total count value $CV_U$ of the total read counter 514. The method then proceeds to block 615.

At block 615, a determination is made as to whether the total count value $CV_T$ is greater than a total count threshold. The total count threshold can be predefined value that can correspond to nominal media scan determinations (e.g., as to nominally when or how often to perform a media scan operation). If the determination at block 615 is positive (e.g., YES), the method 600 proceeds to block 620. If the determination at block 615 is negative (e.g., NO), then the method 600 proceeds to block 625, at which the method 600 ends. The method 600 can thus begin again in response to another read operation at block 605.

At block 620, the virtual block control module 113 initiates a media scan operation. However, before implementing the media scan operation, the virtual block control module 113 selects which of the HGBs of the virtual block 107 to provide a media scan on the wordline(s) thereof. To select the appropriate fractional good block for the media scan operation, the method 600 proceeds to block 630. At block 630, the virtual block control module 113 determines which of the upper count value $CV_U$ and the lower count value $CV_L$ has the highest count value $CV_{HST}$. The virtual block control module 113 can thus compare the upper count value $CV_U$ and the lower count value $CV_L$ for determination of the highest count value $CV_{HST}$. The method then proceeds to block 635.

At block 635, the virtual block control module 113 calculates the selective scan threshold. To calculate the selective scan threshold, the virtual block control module 113 can access the temperature data 516 to determine the ambient temperature of the memory device 130, and can determine the nominal threshold. The nominal threshold can be calculated based on a difference (e.g., an average) of the upper count value $CV_U$ and the lower count value $CV_L$. The virtual block control module 113 can thus determine which of the temperature weights 518 (e.g., as provided in Table 1) to use for the calculation based on the ambient temperature in the temperature data 516, and can multiply the appropriate temperature weight 518 to the nominal threshold to calculate the selective scan threshold. The method 600 then proceeds to block 640.

At block 640, a determination is made as to whether the highest count value $CV_{HST}$ is greater than the selective scan threshold calculated at block 635. If the determination at block 640 is negative (e.g., NO), the method 600 proceeds to block 645. If the determination at block 640 is positive (e.g., YES), then the method 600 proceeds to block 650. At block 645, in response to determining that the highest count value $CV_{HST}$ is less than the selective scan threshold, the virtual block control module 113 arbitrarily (e.g., nominally or randomly) selects one of the HGBs of the virtual block 107 to perform the media scan operation on the wordline(s) therein. The method 600 then proceeds to block 655, at which the media scan operation is performed on the wordline(s) of the selected HGB. The method then proceeds to block 625, at which the method 600 ends. The method 600 can thus begin again in response to another read operation at block 605.

At block 650, in response to determining that the highest count value $CV_{HST}$ is greater than the selective scan threshold, the virtual block control module 113 selects the respective one of the HGBs that has the highest count value $CV_{HST}$ to perform the media scan operation on the wordline(s) therein. The method 600 then proceeds to block 655, at which the media scan operation is performed on the wordline(s) of the selected HGB. The method then proceeds to block 625, at which the method 600 ends. The method 600 can thus begin again in response to another read operation at block 605. Accordingly, the method 600 can determine the health (e.g., reliability) of the virtual block 107 based on a worst case scenario to mitigate the deleterious effects of RD stress and/or RDCL on the virtual block 107.

Figure 7:
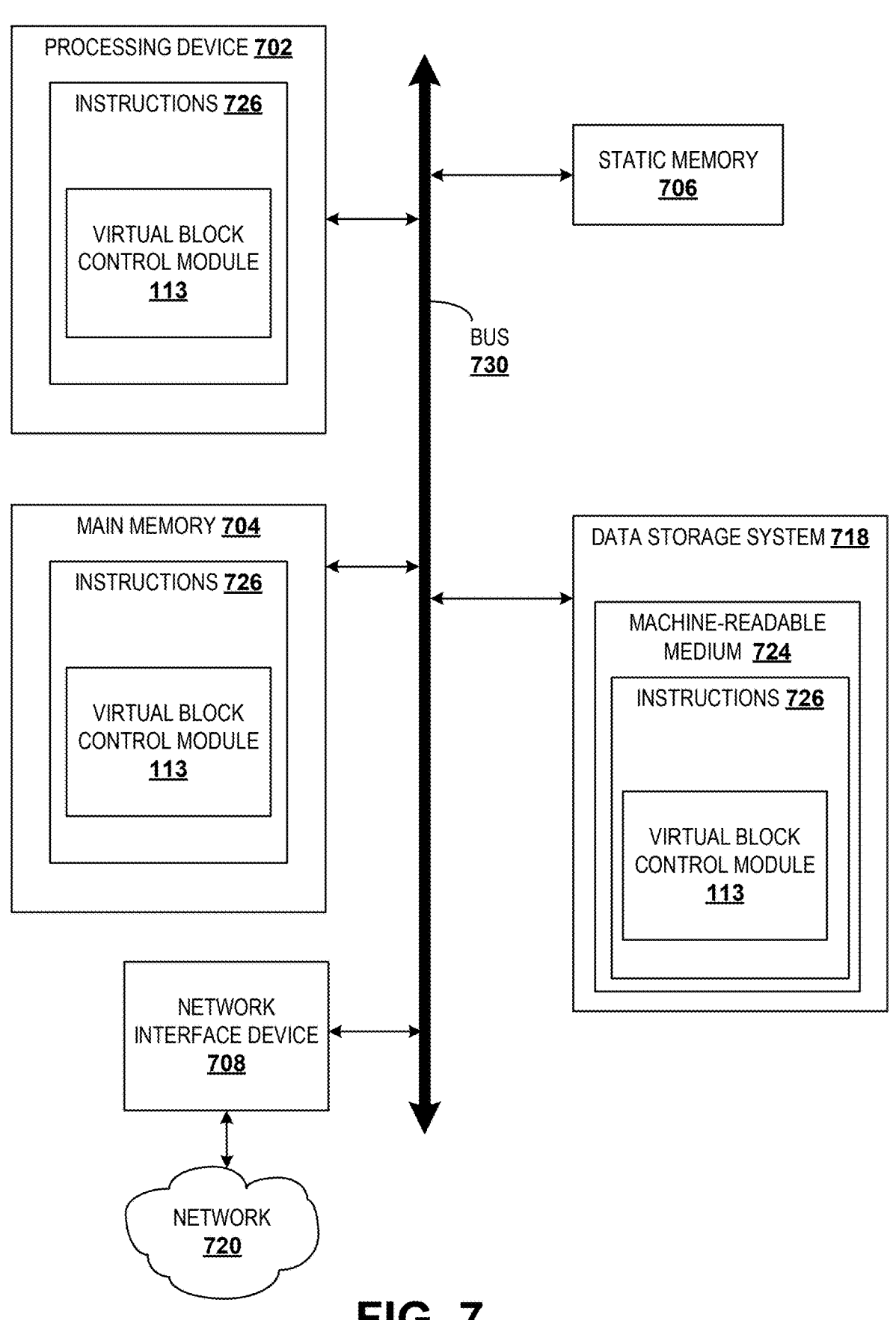
FIG. 7 illustrates an example of a computer system in which examples of the present description may operate.

FIG. 7 illustrates an example machine of a computer system 700 (a machine) within which a set of instructions, for causing the machine to perform any one or more of the methodologies discussed herein, can be executed. In some examples, the computer system 700 corresponds to a host system (e.g., the host system 120 of FIG. 1A) that includes, is coupled to, or utilizes a memory sub-system (e.g., the memory sub-system 110 of FIG. 1A) or is used to perform the operations of a controller (e.g., to execute an operating system to perform operations corresponding to the virtual block control module 113 of FIG. 1A). In other examples, the machine is connected (e.g., networked) to other machines in a LAN, an intranet, an extranet and/or the Internet. In various examples, the machine operates in the capacity of a server or a client machine in client-server network environment, as a peer machine in a peer-to-peer (or distributed) network environment or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge or any machine capable of executing a set of instructions (sequential or otherwise) that specify actions to be taken by that machine. In other examples, the machine may be a computer within an automotive application, a data center, a smart factory, or other industrial application. Further, while a single machine is illustrated, the term "machine" shall also be taken to include any collection of machines that individually or jointly execute a set (or multiple sets) of instructions to perform the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM) or other non-transitory computer-readable media) and a data storage system 718, which communicate with each other via a bus 730.

The processing device 702 represents one or more general-purpose processing devices such as a microprocessor, a central processing unit, etc. More particularly, the processing device 702 can be a complex instruction set computing (CISC) microprocessor, reduced instruction set computing (RISC) microprocessor, very long instruction word (VLIW) microprocessor or a processor implementing other instruction sets or processors implementing a combination of instruction sets. In some examples, the processing device 702 is implemented with a special-purpose processing devices such as an application specific integrated circuit (ASIC), a field programmable gate array (FPGA), a digital signal processor (DSP), network processor, etc. The processing device 702 is configured to execute instructions 726 for performing the operations discussed herein. In some examples, the computer system 700 includes a network interface device 708 to communicate over the network 720.

The data storage system 718 includes a machine-readable storage medium 724 (also known as a computer-readable medium) that store sets of instructions 726 or software for executing the methodologies and/or functions described herein. The machine-readable storage medium 724 is a non-transitory medium. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718 and/or main memory 704 can correspond to the memory sub-system 110 of FIG. 1A. Accordingly, the machine-readable storage medium 724, the data storage system 718 and/or the main memory 704 are examples of non-transitory computer-readable media.

In some examples, the instructions 726 include instructions to implement functionality corresponding to the virtual block control module 113 of FIG. 1A. As an example, the instructions can include incrementing read counters for every read operation to a virtual block and determining which fractional good block of the virtual block to select for providing a media scan operation on one or more wordlines thereof. While the machine-readable storage medium 724 is shown in an example to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared and otherwise manipulated. It has proven convenient at times, principally for reasons of common usage, to refer to these signals as bits, values, elements, symbols, characters, terms, numbers, etc.

It is noted, however, that all of these and similar terms are to be associated with the appropriate physical quantities and are merely convenient labels applied to these quantities. This description can refer to the action and processes of a computer system or similar electronic computing device that manipulates and transforms data represented as physical (electronic) quantities within the computer system's registers and memories into other data similarly represented as physical quantities within the computer system memories or registers or other such information storage systems.

This description also relates to an apparatus for performing the operations herein. This apparatus can be specially constructed for the intended purposes or this apparatus can include a general purpose computer selectively activated or reconfigured by a computer program stored in the computer. Such a computer program can be stored in a computer readable storage medium, such as, but not limited to, any type of disk including floppy disks, optical disks, CD-ROMs, magnetic-optical disks, read-only memories (ROMs), random access memories (RAMs), EPROMS, EEPROMs, magnetic or optical cards or any type of media suitable for storing electronic instructions, each coupled to a computer system bus.

The algorithms and displays presented herein are not inherently related to any particular computer or other apparatus. Various general purpose systems can be used with programs in accordance with the descriptions herein, or it can prove convenient to construct a more specialized apparatus to perform the method. In addition, the present disclosure is not described with reference to any particular programming language. It will be appreciated that a variety of programming languages can be used to implement the teachings of the disclosure as described herein.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications and variations that fall within the scope of this application, including the appended claims. As used herein, the term "includes" means includes but not limited to, the term "including" means including but not limited to. The term "based on" means "based at least in part on". Additionally, where the disclosure or claims recite "a," "an," "a first" or "another" element, or the equivalent thereof, it should be interpreted to include one or more than one such element, neither requiring nor excluding two or more such elements.

What is claimed is:

1. A method for performing a media scan operation on a virtual block in a memory device, the method comprising:
   incrementing a first count value of a first read counter via a controller in response to a first read operation performed on a first fractional good block of the virtual block;
   incrementing a second count value of a second read counter via the controller in response to a second read operation performed on a second fractional good block of the virtual block;
   initiating the media scan operation via the controller;
   selecting one of the first and second fractional good blocks for the media scan operation via the controller based on a difference between the first and second count values, wherein the selecting of one of the first and second fractional good blocks further comprises:
      determining which of the first and second count values has a highest count value;
      comparing the highest count value with a selective scan threshold; and
      selecting the respective one of the first and second fractional good blocks for the media scan operation based on the highest count value relative to the selective scan threshold; and
   performing the media scan operation on a wordline of the selected one of the first and second fractional good blocks via the controller.

2. The method of claim 1, wherein initiating the media scan operation comprises:
   incrementing a total count value of a total read counter in response to either the first or the second read operation; and
   initiating the media scan operation in response to the total count value being greater than a total count threshold.

3. The method of claim 1, wherein selecting the respective one of the first and second fractional good blocks for the media scan operation further comprises:
   selecting the wordline from an arbitrary one of the first and second fractional good blocks for the media scan operation in response to the highest count value being less than the selective scan threshold; and
   selecting the respective one of the first and second fractional good blocks for the media scan operation in response to the highest count value being greater than the selective scan threshold.

4. The method of claim 1, wherein comparing the highest count value with the selective scan threshold comprises:
   determining an ambient temperature of the memory device; and
   adjusting the selective scan threshold based on the ambient temperature of the memory device.

5. The method of claim 4, wherein adjusting the selective scan threshold comprises:
   determining a threshold weight value based on the ambient temperature of the memory device; and
   multiplying a nominal threshold value by the threshold weight value to generate the selective scan threshold.

6. The method of claim 5, further comprising determining the nominal threshold value based on the difference between the first and second count values.

7. The method of claim 6, wherein determining the nominal threshold value comprises setting the nominal threshold value to an average value of the first and second count values.

8. The method of claim 1, wherein the first read counter is a read counter associated with a first physical block that includes the first fractional good block of the virtual block, wherein the second read counter is a read counter associated with a second physical block that includes the second fractional good block of the virtual block.

9. A method for performing a media scan operation on a virtual block in a memory device, the method comprising:
   incrementing a first count value of a first read counter via a controller in response to a first read operation performed on a first fractional good block of the virtual block;
   incrementing a second count value of a second read counter via the controller in response to a second read operation performed on a second fractional good block of the virtual block;
   initiating the media scan operation via the controller;
   selecting one of the first and second fractional good blocks for the media scan operation via the controller based on a difference between the first and second count values;
   performing the media scan operation on a wordline of the selected one of the first and second fractional good blocks via the controller, wherein incrementing the first count value comprises incrementing the first count value of the first read counter in response to the first read operation performed on a first third good block (TGB) of the virtual block;
   wherein incrementing the second count value comprises incrementing the second count value of the second read counter in response to the second read operation performed on a second TGB of the virtual block;
   the method further comprising incrementing the third count value of a third read counter in response to a third read operation performed on a third TGB of the virtual block;
   wherein selecting comprises selecting one of the first, second, and third TGBs for the media scan operation based on a difference between the first, second, and third count values; and
   wherein performing the media scan operation comprises performing the media scan operation on the wordline of the selected one of the first, second, and third TGBs.

10. A system for performing a media scan operation in a memory device, comprising:
   the memory device; and
   a processing device coupled to the memory device, the processing device to perform operations comprising:
      incrementing a first count value of a first read counter in response to a first read operation performed on a first fractional good block of a virtual block;
      incrementing a second count value of a second read counter in response to a second read operation performed on a second fractional good block of the virtual block;
      initiating the media scan operation;
      selecting one of the first and second fractional good blocks for the media scan operation based on a difference between the first and second count values, wherein selecting the respective one of the first and second fractional good blocks for the media scan operation comprises:

determining which of the first and second count values has a highest count value;

comparing the highest count value with a selective scan threshold;

selecting a wordline from an arbitrary one of the first and second fractional good blocks for the media scan operation in response to the highest count value being less than the selective scan threshold; and selecting the respective one of the first and second fractional good blocks for the media scan operation in response to the highest count value being greater than the selective scan threshold; and performing the media scan operation on the wordline of the selected one of the first and second fractional good blocks.

11. The system of claim 10, wherein initiating the media scan operation comprises:

incrementing a total count value of a total read counter in response to either the first or the second read operation; and initiating the media scan operation in response to the total count value being greater than a total count threshold.

12. The system of claim 10, wherein comparing the highest count value with the selective scan threshold comprises:

determining an ambient temperature of the memory device;

determining a threshold weight value based on the ambient temperature of the memory device; and multiplying a nominal threshold value by the threshold weight value to generate the selective scan threshold.

13. The system of claim 12, further comprising setting the nominal threshold value to an average value of the first and second count values.

14. A non-transitory computer-readable storage medium comprising instructions that, when executed by a processing device, cause the processing device to perform a media scan operation on a memory device, the media scan operation comprising:

incrementing a first count value of a first read counter in response to a first read operation performed on a first fractional good block of a virtual block;

incrementing a second count value of a second read counter in response to a second read operation performed on a second fractional good block of the virtual block;

initiating the media scan operation;

selecting one of the first and second fractional good blocks for the media scan operation based on a difference between the first and second count values, wherein selecting the respective one of the first and second fractional good blocks for the media scan operation comprises:

determining which of the first and second count values has a highest count value;

comparing the highest count value with a selective scan threshold;

selecting a wordline from an arbitrary one of the first and second fractional good blocks for the media scan operation in response to the highest count value being less than the selective scan threshold; and selecting the respective one of the first and second fractional good blocks for the media scan operation in response to the highest count value being greater than the selective scan threshold; and performing the media scan operation on the wordline of the selected one of the first and second fractional good blocks.

15. The medium of claim 14, wherein initiating the media scan operation comprises:

incrementing a total count value of a total read counter in response to either the first or the second read operation; and initiating the media scan operation in response to the total count value being greater than a total count threshold.

16. The medium of claim 14, wherein comparing the highest count value with the selective scan threshold comprises:

determining an ambient temperature of the memory device;

determining a threshold weight value based on the ambient temperature of the memory device; and multiplying a nominal threshold value by the threshold weight value to generate the selective scan threshold.

17. The medium of claim 16, further comprising setting the nominal threshold value to an average value of the first and second count values.

* * * * *